(12) United States Patent
Yuan et al.

(10) Patent No.: US 8,923,129 B1
(45) Date of Patent: *Dec. 30, 2014

(54) ADAPTIVE DATA UNIT TRANSMISSION AND ACKNOWLEDGMENT

(71) Applicant: Google Inc., Mountain View, CA (US)

(72) Inventors: Yuan Yuan, Sunnyvale, CA (US); Kevin C. Yu, Palo Alto, CA (US); Michial Allen Gunter, Oakland, CA (US); C. Philip Gossett, Mountain View, CA (US); David James Carmichael, Zurich (CH)

(73) Assignee: Google Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/752,288

(22) Filed: Jan. 28, 2013

Related U.S. Application Data

(63) Continuation of application No. 12/815,997, filed on Jun. 15, 2010, now Pat. No. 8,363,550.

(51) Int. Cl.
*H04L 1/00* (2006.01)
*H04W 24/04* (2009.01)

(52) U.S. Cl.
CPC ..................................... *H04W 24/04* (2013.01)
USPC ......................................................... 370/235

(58) Field of Classification Search
USPC .......................... 370/229–235, 389, 391, 394, 370/395.5–395.52, 469–477; 714/748–749
See application file for complete search history.

(56) References Cited

U.S. PATENT DOCUMENTS

| | | | |
|---|---|---|---|
| 5,448,561 A | 9/1995 | Kaiser et al. | |
| 7,072,973 B1* | 7/2006 | Newson et al. | 709/232 |
| 7,158,479 B1* | 1/2007 | Noble | 370/229 |
| 7,551,556 B2* | 6/2009 | Henriques et al. | 370/230 |
| 8,274,996 B1 | 9/2012 | Yuan et al. | |
| 8,320,252 B2* | 11/2012 | Derom et al. | 370/235 |
| 8,363,550 B1 | 1/2013 | Yuan et al. | |
| 2003/0198183 A1* | 10/2003 | Henriques et al. | 370/229 |

OTHER PUBLICATIONS

Kurose, James F. And Keith W. Ross. "Computer Networking: A Top-Down Approach Featuring the Internet." Second Edition, Pearson Education, Inc, 2003.
Peterson, Larry L. and Bruce S. Davie. "Computer Networks: A Systems Approach", Third Edition, Morgan Kaufmann, 2000.

* cited by examiner

*Primary Examiner* — Frank Duong
(74) *Attorney, Agent, or Firm* — Fish & Richardson P.C.

(57) ABSTRACT

In general, the subject matter described in this specification can be embodied in methods, systems, and program products for adaptive data unit transmission. A sliding window is filled with data units and designates a sliding window start position and a sliding window end position. A value for each of the data units in the sliding window is stored, the value representing a maximum number of times that each data unit is to be transmitted. The stored value is different among at least two of the data units. Data units are selected from the sliding window to be assembled into a packet. An assembled packet is transmitted to a receiving computerized device. A determination that the data unit positioned at the sliding window start position has been transmitted a maximum number of time is performed, and in response a different data unit is positioned at the sliding window start position.

20 Claims, 8 Drawing Sheets

ADAPTIVE DATA UNIT TRANSMISSION AND ACKNOWLEDGMENT

CROSS-REFERENCE TO RELATED APPLICATIONS

This application claims priority to U.S. application Ser. No. 12/815,997 filed on Jun. 15, 2010, entitled "Adaptive Data Unit Transmission and Acknowledgement", the entire contents of which are hereby incorporated by reference.

TECHNICAL FIELD

This document generally describes techniques, methods, systems, and mechanisms for performing adaptive data unit transmission and acknowledgment.

BACKGROUND

The present disclosure generally relates to electronically transmitting data between computing devices. Modern wireless data communication systems provide bandwidth for use by rich computing applications on mobile devices. For example, users of wireless devices such as smart phones can make telephone calls, receive emails, and even receive full motion audio/video broadcasts on their mobile devices. Every time a great new service is offered, users of wireless devices consume data associated with the service, requiring more and more bandwidth. As a result, the airwaves are filled with data going to and from an increasing number of wireless computing devices that each require growing amounts of data.

A data packet transmitted in such a wireless communication system may not always be received by an intended recipient computing device. Interfering signals from other computing devices or from natural phenomena may overpower the portion of the signal that includes the data packet so that the entire data packet, or portions thereof, are unintelligible to the receiving device or include errors. Similarly, either the transmitting or receiving device may temporarily move behind an obstruction, so that communication signals between the devices are blocked for a temporary period of time.

Because data packets are sometimes not received, a device that receives a packet may send an acknowledgment back to the transmitting device in order to let the transmitting device know that the packet was received. If the transmitting device does not receive an acknowledgment for a particular packet within a time period, the transmitting device may retransmit the particular packet.

SUMMARY

This document generally describes adaptive data unit transmission and acknowledgment. In general, two computerized devices (e.g., a mobile smartphone and an access point interface) that communicate over a wired or wireless network may employ sliding window mechanisms to assemble packets for transmission to each other, and to reassemble received packets. Each individual byte in a sending sliding window may be associated with a flag that indicates whether or not an acknowledgment from the other device has been received for the byte. Bytes that have not been acknowledged after a given period of time may be reassembled into new packets and retransmitted to the other computerized device.

A computerized device may continue to retransmit each byte in the sliding window until the byte has either been acknowledged or retransmitted a maximum number of times. The maximum number of retransmissions that are attempted for each byte may depend on a type of information represented by the byte. For example, if the byte represents voice information, then the maximum number of retransmissions may be a low number (e.g., 2) because the quality of a voice signal may not be very important but latency would be significant. On the other hand, if the byte represents encrypted banking communications, the maximum number of retransmissions may be very high (e.g., 26) because the quality of the communication may be very important, but latency would not be as significant of a concern.

Each computerized device may acknowledge received packets by sending two values to the device that transmitted the packets. A first value can identify a packet (e.g., a most recently-received packet or a most recently-received and acknowledged packet). A second value can represent a bit-mask. Each bit in the bit mask may identify whether or not a single packet that is in an offset relationship to the identified packet has been received. For example, the bits in the bit mask may represent an adjacent sequence of transmitted packets. The sequence of transmitted packets may include or may not include the identified packet. The sequence of packets may be associated with a pre-defined relationship to the identified packet (e.g., the sequence of packets that were transmitted immediately after the identified packet).

In general, one aspect of the subject matter described in this specification can be embodied in a method for adaptive data unit transmission. The method includes filling, by a sending computerized device, a sliding window with data units that are to be transmitted to a receiving computerized device. The sliding window includes, among multiple data units, a data unit that is designated as being positioned at a sliding window start position and a data unit that is designated as being positioned at a sliding window end position. The method includes storing, for each particular one of the multiple data units in the sliding window, a value that represents a maximum number of times that the particular data unit is to be transmitted. The stored value is different among at least two of the data units in the sliding window. The method includes selecting, from the sliding window, data units to be assembled into a packet, and transmitting an assembled packet of the selected data units to the receiving computerized device. The method includes determining that that the data unit that is designated as being positioned at the sliding window start position has been transmitted a particular number of times that is based off of the value that represents the maximum number of times that the particular data unit can be transmitted and, in response, designating a different data unit as being positioned at the sliding window start position.

Another aspect of the subject matter described in this specification can be embodied in a computer-implemented method for receiving data unit acknowledgments. The method includes filling, by a sending computerized device, a sliding window with data units that are to be transmitted to a receiving computerized device. The sliding window includes, among multiple data units, a data unit that is designated as being positioned at a sliding window start position and a data unit that is designated as being positioned at a sliding window end position. The method includes selecting, from the sliding window, data units to be assembled into a packet, and transmitting the assembled packet of selected data units to the receiving computerized device. The method includes receiving, at the sending computerized device and from the receiving computerized device: (i) an identification of a packet that was transmitted from the sending computerized device to the receiving computerized device, and (ii) a mask that identifies whether each of a sequential group of packets transmitted from the sending computerize device is acknowledged by the receiving computerized device.

In yet another aspect, the subject matter described in this specification can be embodied in a computer-implemented. The method includes filling, by a sending computerized device, a sliding window with data units that are to be transmitted to a receiving computerized device. The sliding window includes, among multiple data units, a data unit that is designated as being positioned at a sliding window start position and a data unit that is designated as being positioned at a sliding window end position. The method includes storing, for each particular one of the multiple data units in the sliding window, a value that represents a maximum number of times that the particular data unit is to be transmitted. The stored value is different among at least two of the data units in the sliding window. The method includes selecting, from the sliding window, data units to be assembled into a packet, and transmitting an assembled packet of the selected data units to the receiving computerized device. The method includes determining that that the data unit that is designated as being positioned at the sliding window start position has been transmitted a particular number of times that is based off of the value that represents the maximum number of times that the particular data unit can be transmitted and, in response, designating a different data unit as being positioned at the sliding window start position. The method includes receiving, at the sending computerized device and from the receiving computerized device: (i) an identification of a packet that was transmitted from the sending computerized device to the receiving computerized device, and (ii) a mask that identifies whether each of a sequential group of packets is acknowledged by the receiving computerized device.

These and other implementations can optionally include one or more of the following features. Designating the different data unit as being positioned at the sliding window start position may include shrinking a number of data units in the sliding window such that the data unit being positioned originally at the sliding window start position is no longer included in the sliding window and will no longer be selected from the sliding window for transmission to the receiving computerized device. The method can include storing, for each particular one of the multiple data units in the sliding window, a value representing a number of times that the particular data unit has been transmitted from the sending computerized device to the receiving computerized device. Filling the sliding window with data units can include determining that a number of data units in the sliding window is below a first predetermined threshold number of data units, and selecting data units to include in the sliding window from a packet of a higher layer Open System Interconnection model until the sliding window exceeds a second predetermined threshold number of data units.

The maximum number of transmissions may be a number of retransmissions of the particular data unit. The sliding window may be filled with data units selected from packets of a higher layer Open System Interconnection model. The method may include setting, for each specific data unit in the sliding window, the value that represents the maximum number of times that the specific data unit can be transmitted based on a priority of a packet in the higher layer that the data unit is selected from. All data units in the sliding window that are selected from a same higher layer packet may have a same value that represents the maximum number of times. The data unit may be a byte. The method may include receiving, at the sending computerized device and from the receiving computerized device, an acknowledgment of packets that the receiving computerized device both received from the sending computerized device and that satisfied an error-checking algorithm. The acknowledgment may include: (i) an identification of a packet previously received at the receiving computerized device, and (ii) a mask that includes multiple bits, each bit representing an acknowledgment or non-acknowledgment of a different packet. Selecting data units to be assembled into a packet may include not selecting data units that have been acknowledged and not selecting data units that have been transmitted the particular number of times that is based off of the value that represents the maximum number of times that the data unit can be transmitted. The method may include transmitting the assembled packet from the sending computerized device to the receiving computerized device. The transmitted packet may include a sequence number of the packet that is independent of the position of the data units selected from in the sliding window.

The transmitted packet may include an identification that a data unit selected from the sliding window represents a start of a packet from a higher layer Open System Interconnection model, and may identify which of the selected data units represents the start of the packet from the higher layer. The mask may identify with a single bit, for each specific packet in the group, whether the specific packet is acknowledged. The identification of the packet and the mask may be included in a single packet that is received at the sending computerized device and from the receiving computerized device. The single packet may not include identifications for at least some of the packets in the sequential group. The identification of the packet may be an identifier that is independent from a position of the packet in the sliding window.

The method may include storing at the sending computerized device, for each of the multiple data units in the sliding window that was acknowledged by the receiving computerized device, an indication that the data unit was acknowledged. An acknowledgment of a packet may indicate both that the packet was received by the receiving computerized device and satisfied an error-checking algorithm at the receiving computerized device. The method may include determining, by the receiving computerized device, that multiple packets transmitted by the sending computerized device and received at the receiving computerized device satisfy an error checking algorithm. The method may include transmitting, to the sending computerized device, an acknowledgment of the received packets, wherein the transmission includes: (i) an identification of a most recently received of the multiple packets, and (ii) a mask that identifies for each individual one of a sequential group of packets received before the identified packet, whether the individual packet was received and satisfied an error checking algorithm.

Particular embodiments can be implemented, in certain instances, to realize one or more of the following advantages. An overhead of packets that are generated at a particular layer in an OSI model may be reduced because a size of an acknowledgment that is sent in the packets is reduced in size. The acknowledgment mechanism may be robust because packets may be acknowledged multiple times. Further, the sending and receiving sliding windows may vary in size (e.g., the start position may be independent from the end position) based on when portions of data are acknowledged. The sliding window may have no limitation on window size.

Also, the number of transmissions of a particular data portion in a sliding window may be adjusted for each data portion. Additionally, the sequence number of a transmitted packet and the position of bytes in a sliding window may be separate. Thus, the sequence number may depend on the maximum number of in-flight packets instead of the sliding window size, thereby potentially reducing the number of overhead bytes in a packet used to identify the packet.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Figure 1:
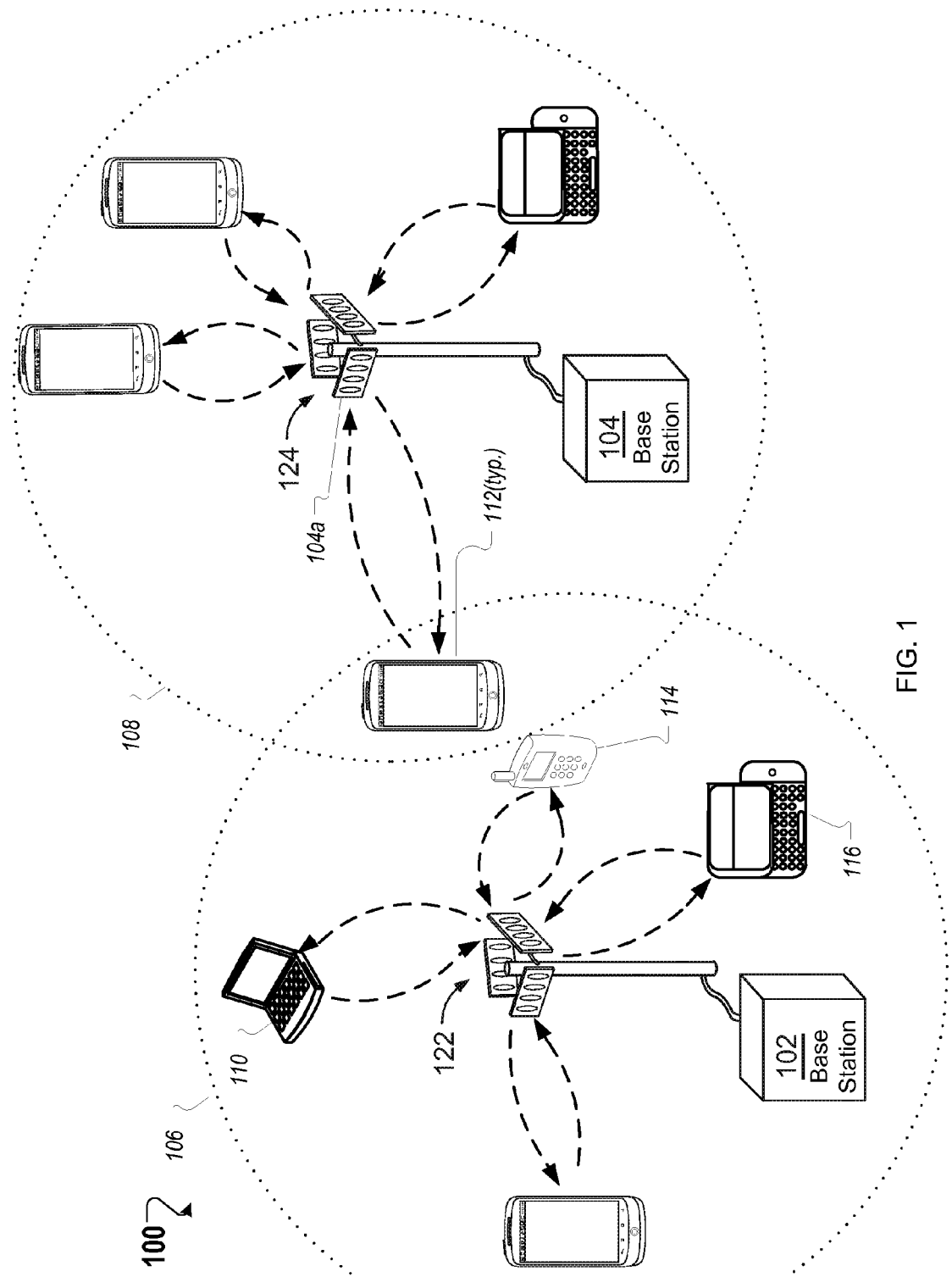
FIG. 1 shows a network of base stations and wireless clients in a wireless communications system.

This document describes techniques, methods, systems, and mechanisms for performing adaptive data unit transmission and acknowledgment. In general, a wireless communication system may include two computerized devices that communicate with each other by wirelessly transmitting packets of data from one device to the other. The two devices may include mechanisms for acknowledging received packets and for retransmitting packets that have not been acknowledged as having been received.

A mobile telephone may transmit packets of data to a base station. Some of the packets, however, may not arrive at the base station because the mobile telephone enters a tunnel, because signals from other mobile telephones interfere with the signals transmitted by the mobile telephone, or because of a variety of other problems. For these reasons, the base station may need to transmit to the mobile telephone an acknowledgment for each packet or portion of data that the base station has correctly received from the mobile telephone.

For example, the base station may receive from the mobile telephone hundreds of packets of information, where each packet includes a sequence number that identifies the packet and distinguishes the packet from all other packets that are transmitted over a given time period (e.g., because the numbers may be reused eventually). For each of the received packets, the base station may perform a cyclic redundancy check (CRC) to determine if the received packet includes any transmission errors. For each packet that is received and that passes the CRC, the base station may store an indication that the base station should send an acknowledgment of the received packet to the mobile telephone.

When the base station transmits a packet of information to the mobile telephone, the packet may include information that identifies the packet that the base station most recently acknowledged. The packet transmitted by the base station to the mobile device may also include a mask (e.g., a sequence of bits) that identifies whether packets that have sequence numbers before the most recently acknowledged packet have been themselves acknowledged.

Each previous packet can be identified as acknowledged or non-acknowledged with a single bit in the mask. For example, the mask may identify whether or not four packets with sequence numbers immediately before the most recently acknowledged packet have been themselves acknowledged. Thus, if the most recently acknowledged packet has a sequence number of "68," while the base station has also acknowledged packets with sequence numbers of "66" and "65," the mask may be "0110" (0 for sequence no. "67," 1 for sequence no. "66," 1 for sequence no. "65," and 0 for sequence no. "64"). Each packet that is transmitted by either the mobile telephone or the base station may include the identification of the most recently acknowledged packet and a corresponding mask.

When the mobile telephone or base station assembles packets for transmission to the other device, bytes for which an acknowledgment has not been received from the other device may be retransmitted. For example, the packets may be assembled at the MAC layer from bytes that are not acknowledged in a "sliding window" mechanism that operates in a cyclical buffer. The number of times that a particular packet or portion of data is retransmitted can vary based on the type of data.

The bytes that are in the sliding window may be filled with data that is from a higher layer in the Open System Interconnection (OSI) model. Data from the packet in the higher layer OSI model may be used to determine how many times to retransmit bytes that are from the higher layer packet. For example, a data table may identify a number of retransmissions for particular types of higher layer packets based on a particular symbol or sequence of characters in a header or body of a higher layer packet. The symbol or sequence of characters may identify a type of the information in the higher layer packet.

The sliding window may grow in size as the window is filled with data from the higher layer (e.g., the end position in the window may move forward in the buffer). Conversely, as data is either acknowledged or retransmitted a maximum number of times, the window may shrink (e.g., the start position may move forward in the buffer). The bytes selected from the sliding window for MAC layer packets may not include bytes that have been retransmitted the maximum number of times.

As the mobile telephone receives the acknowledgments (e.g., the indication of the most recently acknowledged byte and the mask) from the base station, the mobile telephone may store an indication of the acknowledged bytes (e.g., the bytes that are in packets that have been acknowledged). The first device may also store an indication of how many times non-acknowledged data portions have been transmitted and a maximum number of transmissions for each byte based on a type of the data that the byte represents.

FIG. 1 shows an example network of base stations and wireless client devices in a wireless communications system. At a high level, the network 100 is like most broad-based wireless data networks, where various types of computing devices connect to a network via base stations that are geographically spread apart. The devices may be mobile, and thus may be able to transition from one base station to another as they are moved. The coverage of the base stations may overlap in some locations, so that the system 100 may include mechanisms for determining which base station, among a plurality of base stations that could serve a computing device, should serve the computing device.

The network 100, in this example, includes base stations 102 and 104 that are configured to communicate with multiple wireless client devices using a multiple-input multiple-output (MIMO) communication system. An actual network may include many more base stations, but two are illustrated in FIG. 1 for purposes of clarity and simplification. In some implementations, each of the base stations 102 and 104 include arrays of antennas 122 and 124. The radio antennas couple electromagnetic energy from one medium, space, for example, to another, such as wire, coaxial cable, or a waveguide.

In some implementations, a base station communicates with multiple client devices on the same time-frequency resource through spatial separation with the antenna arrays, a practice known as spatial division multiple access (SDMA). In SDMA, an antenna array can form multiple spatial channels to allow several communication links to share the same time-frequency resources. SDMA architecture can enable the channeling of radio signals based on a client device's location. The benefits of multiplexing users in the spatial domain can include extending the range of communication possible between a client device and a base station, and receiving less destructive effects of multipath signals (e.g., those signals that bounce off buildings).

In some implementations, the base station 102 uses the antenna array 122 to communicate with multiple client devices 110, 114, and 116, using a single swath of spectrum that is treated as a single frequency band. The swath of spectrum, however, may include non-contiguous portions of the electromagnetic spectrum. The array of antennas 122 and the client devices 110, 114, and 116 may operate within this swath of spectrum.

In some implementations, the base stations 102 and 104 communicate with client devices over the so-called television white-space frequencies. In some implementations, the base stations 102 and 104 can communicate over the range of frequencies between about 50 MHz to about 700 MHz. In some implementations, the base stations 102 and 104 can communicate over the range of frequencies between about 54 MHz to about 806 MHz. In some implementations, the base stations 102 and 104 can communicate over the range of frequencies between about 698 MHz to about 806 MHz. In some implementations, the base stations operate over frequencies from UHF channels 21-35 (512-602 MHz) and channels 39-51 (620-698 MHz). The base station and wireless devices may treat both sets of UHF channels as a single swath of spectrum.

Additionally, the base stations 102 and 104 can employ dynamic time division multiple access (TDMA) protocol in order to communicate with multiple wireless client devices over a single frequency and within a single spatial channel. The TDMA protocol allocates slices of time during which certain of the devices in a spatial channel will transmit and/or receive information, while the other devices wait their turn. In some implementations, the combination of SDMA and TDMA allows each base station 102 and 104 to communicate with approximately 10,000 client devices. The antenna array for each base station 102 and 104 may include 40 antennas.

The network 100 may be designed to be a low signal-to-interference ratio (SIR) system. A low SIR system can be a system where the ratio of the strength of signals received at the base station and at client devices to the strength of undesired signals (noise and interference) is low. Thus, signals will not be transmitted with as much power as in a high SIR system. A low SIR system can reduce interference to neighboring cells. In some implementations, the described system regularly operates below 0 dbm and may be able to operate down to −15 dbm.

A system designed to be low SIR can be more robust against interference from devices that are under the network's control. Thus, viewing a specific client device in a MIMO system can be much easier in a low SIR system as the interference from one spatial degree of freedom to another is reduced. Further, with less potential of interference from other spatial degrees of freedom, the channel estimations do not need to be as accurate. Additionally, a low SIR system is more robust to interference from devices that are not under the network's control. This benefit is especially important when using unlicensed spectrum where devices may use the spectrum without permission (e.g., when operating in the unlicensed TV whitespace spectrum).

The base stations 102 and 104 are configured to communicate with a variety of wireless devices. For example, the base station 102 can communicate with personal computers, laptop computers (e.g. computer 110), cellular phones (e.g. telephone 114), including smart phones (e.g. smart phone 116), personal digital assistants (PDAs), pagers, video game consoles, and other wireless computing devices such as netbooks. The network can be designed to leverage TCP/IP as much as possible so that voice, data, etc. is encoded in IP.

Each of the base stations 102 and 104 can communicate with client devices located within a geographic area around the respective base station, where the area is nominally defined as a circle, but may vary from a circle because of signal interference (e.g., weather, geographic barriers, buildings, etc.). For example, the base station 102 can communicate with devices within a geographic area 106 and the base station 104 can communicate with devices within a geographic area 108. In some implementations, each base station 102 and 104 can communicate with client devices located within a designated radius of each base station (e.g. a 12 km radius). In some implementations, the size of a geographic area for a base station depends on the transmission power of the base station.

In some implementations, a particular client device can be located simultaneously within geographic coverage areas for multiple base stations. For example, a wireless device 112 is located within the geographic area 106 and the geographic area 108. In such circumstances, the wireless device 112 is capable of communicating with the base station 102 or the base station 104 (or it could communicate with both). In some implementations, the wireless device 112 can elect to associate with the base station 102 or 104 that has the strongest signal at the location of the wireless device 112. In some implementations, the wireless device 112 can elect to associate with the base station 102 or 104 that has the best signal-to-noise ratio.

As noted above, the base stations 102 and 104 can use a time division multiple access (TDMA) protocol to communicate with multiple client devices over a single frequency band. Communications within this structure can occur in repeating structures known as frames of information, where each frame may have a defined structure. Frames are constructs whose defined structure is understood by both wireless devices and base stations, so that each device knows when it is allowed to communicate and what data should be communicated during a particular time slice. During portions of a frame, a client device may be permitted to transmit, receive, or wait and listen. The general structure and function of frames is well-known.

Transmission time in the network 100 can be divided into uplink and downlink times. In some implementations, the amount of time devoted to uplink and downlink can be equal. In other implementations, time can be split between uplink and downlink times using a relatively arbitrary ratio. For example, two thirds of time can be allocated for uplink time and one third of time can be allocated for downlink time.

Figure 2:
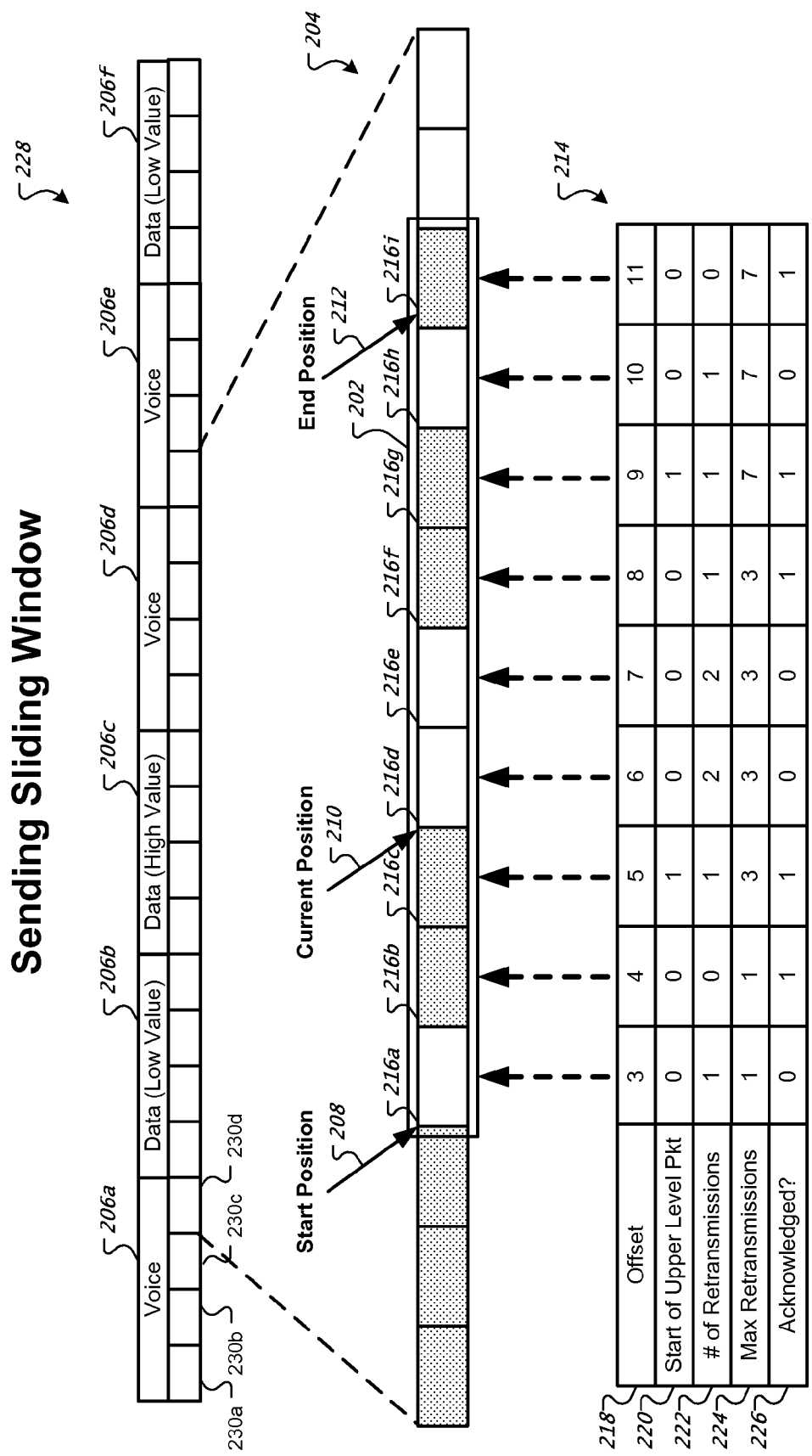
FIG. 2 illustrates a sending sliding window mechanism.

FIG. 2 illustrates a sending sliding window mechanism. The sending sliding window 202 may be implemented on a computerized device as part of a packet exchange procedure for generating packets for wireless communication with another device. In some examples, the described procedure discusses a bi-directional transmission protocol that can be used in the data link layer as well as in the TCP (transport layer). Thus, two devices that are in wireless communication with each other may each employ the sending sliding window 202 for generating packets for transmitting to other devices.

The sending sliding window mechanism may fill the sending sliding window 202 with data portions from IP packets, effectively splitting the IP packets into smaller packets that have a size that is based on the physical-layer data rate. The selection of data portions for each smaller packet may be based on which data portions in the sliding window have not been acknowledged and have not been retransmitted a maximum number of times. The smaller packets are passed to a lower layer in an ISO model or transmitted to a receiving device, where the received packets are reassembled into the larger IP packets.

More specifically, the sending sliding window 202 is filled with data portions from upper-layer packets that are stored in queue 228. Queue 228 includes multiple IP packets 206a-f that each include multiple bytes (e.g., bytes 230a-d). The IP packets may be provided for wireless transmission to other computerized devices by several different computer programs. Each computer program may have different packet error rate and delay requirements. For example, error-free voice communication may not be prioritized as highly as is timely communication for voice-related transmissions. On the other hand, communications from an email application may not need to be as timely, but should be as accurate as possible.

The sliding window 202 may be defined by a start position 208, end position 212, and current position 210 (all in the cyclic buffer 204). The start position 208 (a.k.a. the "start offset" for the window in the buffer) may designate the first byte of data in the sliding window, while the end position 212 (a.k.a. the "end offset") may designate the last byte of data in the sliding window. A data structure 214 may store information relevant to each slot in the sliding window. The stored information can be used to determine which bytes in the sliding window should be selected for inclusion in a MAC packet, to be used to manage a size of the sliding window, and as a source of information to include in headers of the MAC packet.

The sliding window mechanism works in a cyclic buffer 204 at the byte level and may fill a quarter of the cyclic buffer. Each byte of the sliding window 202 (e.g., bytes 216a-i) has an associated offset position within the buffer 204. The offset position is identified in the "Offset" row 218 of the sliding window data structure 214. As described later, at least one offset position may be sent along with each generated MAC packet to enable the receiving device to place the data portions from the MAC packets into a receiving sliding window. The data structure can also indicate, for each byte in the sending sliding window, whether the byte is the start of an upper level packet (e.g., an IP packet) 220, a number of times 222 that the byte has been retransmitted, a maximum number of times of retransmission for each particular byte 224, and whether or not each byte has been acknowledged 226.

The upper-layer packets 206a-f are appended to the end of the sliding window when the sliding window is determined to meet, fall below, or approach a lower threshold length in bytes. The upper-layer packets are appended to the end of the sliding window until the size of the modified window is close to, but less than an upper threshold number of bytes. In some examples, the upper-layer packets may be appended until the upper threshold number of bytes is exceeded. The end position 212 is updated to reflect the last byte of the newly appended packets.

The start position 208 advances to shrink the sliding window when the leading byte in the sliding window is either acknowledged or is transmitted a maximum number of times (e.g., when the number of retransmissions 222 for "Offset 0" is one less than, the same as, or exceeds the max retransmissions 224 for "Offset 0." The end position 212, start position 208, and current position 210 may be pointers to slots in the cyclic buffer 204.

Starting at the current position 210, bytes that have not been acknowledged (e.g., the bytes that are not shaded in the sliding window 202) are selected to form a MAC packet. Accordingly, selective repeat ARQ (Automatic Repeat re-Quest) is implemented so that acknowledged bytes are not re-transmitted. In some examples, bytes that meet or exceed the maximum number of transmissions will not be selected for assembly into a MAC packet. Each successive non-acknowledged byte may be selected for inclusion in the MAC packet that is being assembled until an appropriate number of data bytes is selected.

In some examples, bytes are selected until a byte that has been retransmitted a maximum number of times is encountered. Thus, a packet that is assembled based on the selected bytes may vary in size. In this manner, a receiving window (described below) may correctly place received bytes in an appropriate location in the receiving window using an offset 218 of the starting byte in the packet and a successive chunk of received bytes. The appropriate number of data bytes that are selected may depend on the requirements of the physical link layer.

A MAC packet is generated, in part, with the selected bytes. An example MAC packet is illustrated with reference to FIG. 3. The MAC packet illustrated in FIG. 3 includes a MAC header 302 and a MAC data frame 304 that is filled with the selected bytes. The MAC header includes three fields: a sequence number of the MAC packet 306, a sequence number of a most recently received MAC packet 308, and a bit mask 310. The sending device increases the sequence number 306 by "1" for every new MAC packet. However, if the sequence number exceeds an upper limit, the sequence number is reset (e.g., to "0" or "1"). The mask 310 includes N bits that sequentially represent an acknowledgment status of N packets (where the N packets may include the most recently acknowledged MAC packet 308 and the previous N−1 packets). A bit "1" in the mask of may indicate that a corresponding packet is received, while "0" may indicate that the packet has either not been received or that the packet included an error.

The MAC data frame 304 can include multiple sub packets. Each sub packet may include a header with a byte in a "Packet Type" field that identifies a type of the sub packet. If the packet type is identified as a "Data Packet," the sub packet may take the form of the sub packet 360, which can include additional fields. The "Data Bytes" field 374 includes the data bytes that are selected from the sending sliding window 202. A "First Byte Position" field 368 denotes the offset in the buffer of the first byte that is taken from the sending window. If the first byte of an upper-layer packet is present in the data bytes 374, the data frame header also includes a "Head Position" field 370 that denotes the offset of this first byte in the data bytes 374 or in the sending window 212.

After bytes have been selected from the sending sliding window 202 for formation of a MAC packet, the Current Position 210 is moved to the byte immediately after the bytes that were selected and the number of retransmissions for each byte included in the Data Bytes 374 is increased by "1." A record mapping the sequence number to the offset range of these data bytes is stored for advancing the sending window when an acknowledgment is received.

Figure 3:
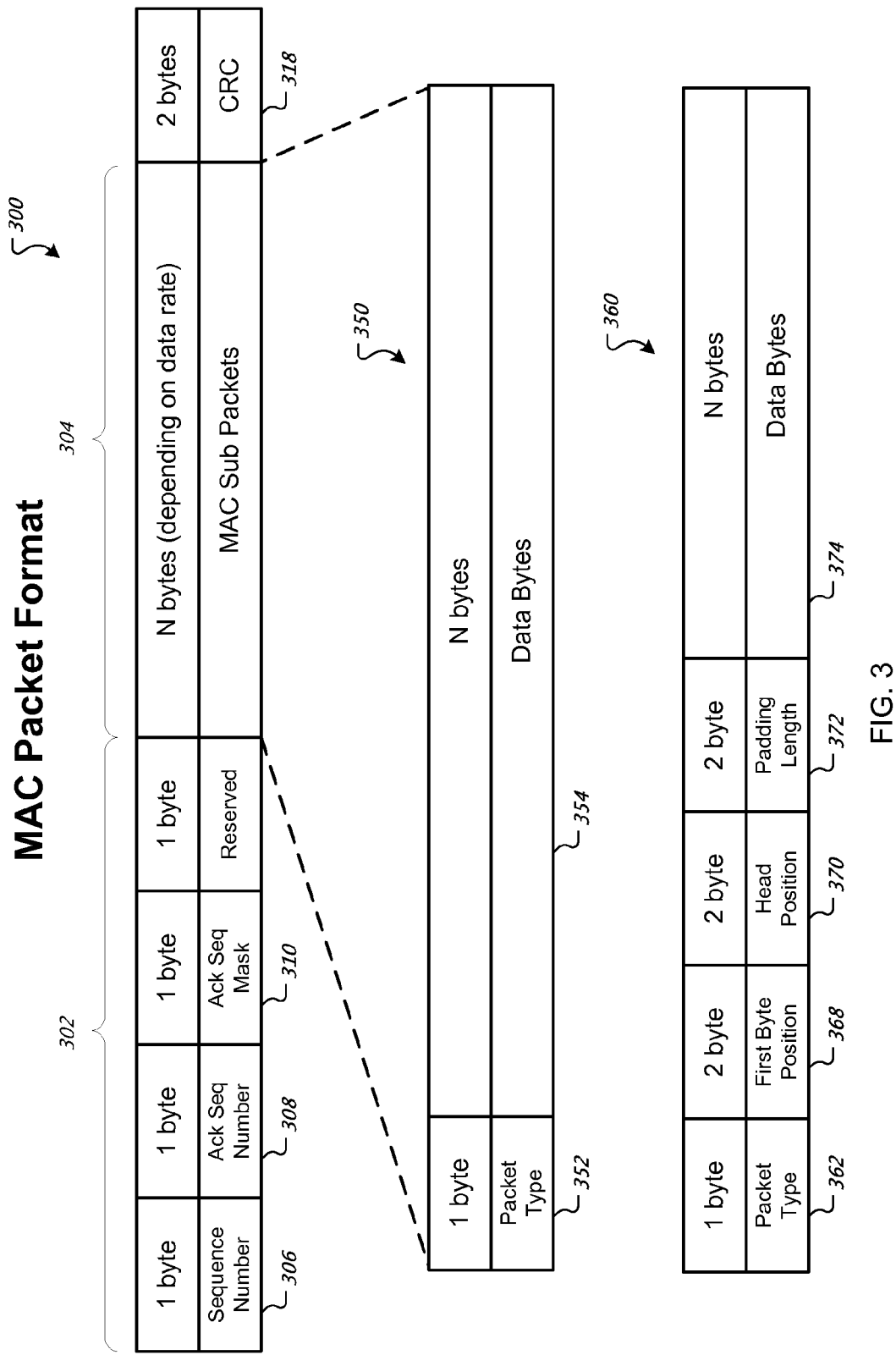
FIG. 3 illustrates an example MAC packet format.

FIG. 3, illustrating an example MAC packet format, is described more particularly below.

The "Sequence Number" field 306 may denote the sequence number of the MAC packet. The sending computerized device may incrementally increase the value that is placed into a sequence number field in every generated MAC packet. When the sequence number reaches a determined value, it may be reset to "0."

The "Ack Seq Number" field may indicate the last sequence number of the packet that the device that is transmitting the MAC packet has acknowledged. For example, a first and a second device may be sending packets back and forth between each other. The second device may transmit a packet to the first device and may include a sequence number of a last packet received from the first device that has been determined to be error free (e.g., the packet has passed a CRC check).

The "Ack Seq Mask" field 310 may include an eight-bit mask that indicates whether the packets with the sequence number of "Ack Seq Number–7" to "Ack Seq Number" are received error-free, or have been lost in transmission. In some implementations, the mask does not include a bit that indicates an acknowledgment status of the "Ack Seq Number," as the use of the Ack Seq Number may indicate an error-free receipt. Thus, the mask may apply to packets from "Ack Seq Number–8" to "Ack Seq Number–1" (assuming the mask is an 8 bit byte). The mask may be referenced as applying to bits that are adjacent or offset from the ack seq number. The bits may be referred to as being "sequential" if the bits apply to sequentially numbered packets without any intervening numbers. "Sequential" may also refer to bits applying to a determined pattern of bits (e.g., every other bit behind the Ack Seq Number).

The "MAC Data Frame" field 304 may include multiple MAC sub packets 350. The sub packets can carry data, request a schedule, grant a schedule, and change the transmission rate.

The "CRC" field 318 can include a checksum that is designed for use to detect accidental changes to computer data that is included in the MAC packet. Thus, it may be used to verify the correctness of the MAC layer packet.

An example MAC Sub Packet format 350 may include a "Packet Type" field 352 that can denote a type of the MAC Sub Packet. The Sub Packet 350 may also include a MAC Sub PayLoad 354 that may be N bytes long, depending on the data included in the payload. The "Packet Type" field 352 may include values that designate different types of sub packets, for example, a Schedule Request type, a Schedule Grant type, a Transmission Rate Update type, a Data Packet type, and a Padding Packet type.

A MAC Sub Packet format with a "Packet Type" designated as a "Data Packet" is illustrated as the sub packet format 360. Accordingly, the field "Packet Type" 362 includes a value that designates the packet as a "Data Packet." The "First Byte Position" field 388 may define the position of the first byte in the data packet as an offset in the buffer 204 for the sending sliding window. For example, if the first of several bytes included in the "Data Bytes" field 374 is selected from the offset position "5" in the sending window 202, the field 368 may include a value of "5."

The "Head Position" field 370 may include a position, in the MAC Sub Packet format for carrying data 360 or in the sending sliding window, of a first byte of a packet header for an upper-layer packet. For example, if the "Data Bytes" field 374 includes a first byte of an IP packet from the queue 228, then the "Head Position" field 370 may identify which of the Data Bytes 314 is the first byte of the IP packet. In some examples, the size of a packet from an upper level ISO layer (e.g., an IP packet) is larger than the amount of data bytes 374 contained in a MAC packet. Thus, the MAC packet may not include more than one "first byte of an IP packet."

The "Padding Length" field 372 may identify a length of a number of bytes that are added for padding purposes. In some examples, the data sub packet is the last packet in a list of MAC sub packets. In some examples, the head position 370 and padding length fields 372 are optional. The receiving device may be able to determine information from either field by retrieving information from an upper layer header to determine a packet length for extracting the packet. Breaching the layer structure, however, may reduce the scalability of the protocol design, but can decrease a MAC layer packet header size.

Figure 4:
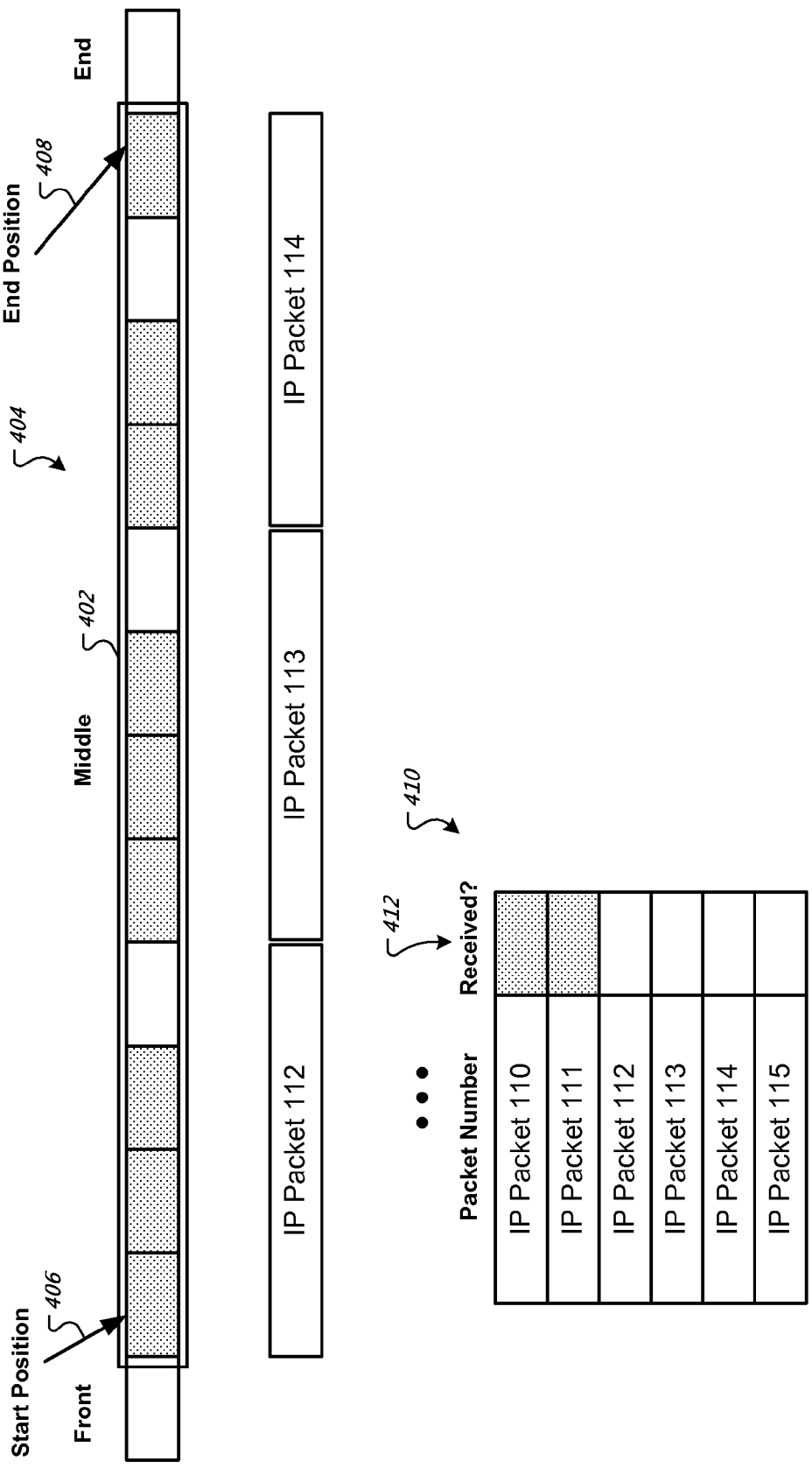
FIG. 4 illustrates a receiving sliding window mechanism.

FIG. 4 illustrates a receiving sliding window mechanism. The receiving sliding window mechanism may implemented at the MAC layer in a device that is receiving incoming packets from a lower layer. The receiving sliding window 402 may be implemented in a cyclic buffer 404 and be designated by a start position 406 and an end position 408.

The illustrated MAC layer receiving sliding window 402 receives incoming bytes from packets of a lower layer. The bytes in the received packets are placed in the buffer 404 according to the position of the first byte identified in the received packet at "First Byte Position" 368. For example, if a MAC packet with four bytes is received and the first byte position 368 identifies the offset as '5,' the bytes may be placed at the positions '5,' '6,' '7,' and '8.'

If any incoming bytes are already included in the receiving window, the incoming bytes may be discarded. In other words, if an incoming byte is determined to be placed at a position where a byte has already been placed in the receiving window 402, the incoming byte may not be placed in the window. Bytes may have been retransmitted by the sending sliding window mechanism if an acknowledgment that was transmitted from the receiving device is lost or if an acknowledgment was not received by the sending device at a time of re-transmission.

The received bytes are next placed in the front, middle, or end of the of the buffer 404, depending on the determined position of the bytes. If the received bytes exceed a "margin" distance before or after the start position 406 or end position 408, respectively, the bytes may be discarded as being out of order. If the received bytes are not in the receiving sliding window but are within a threshold distance, the bytes may be placed in the buffer 404. The receiving sliding window 402 may or may not be expanded to include the received bytes.

Once the newly received bytes have been inserted into the buffer 404, the receiving sliding window mechanism can determine a starting and ending location of upper layer packets (e.g., IP packets) that are represented with a sequence of bytes in the receiving sliding window. For example, the receiving sliding window mechanism may have received identifications of the starts of IP packets (e.g., based on the "Head Position" field 370. If any of the IP packets identified in the receiving sliding window 402 are determined to be complete (e.g., if all the bytes in the IP packet have been received and have passed the CRC), the data bytes may be extracted, assembled into an IP packet, and passed to an upper layer.

A separate data structure 410 may store indications of whether each of a sequential listing of the IP packets has been received. If a packet has been assembled into an IP packet and passed to an upper layer, an indication that the respective IP packet has been received may be stored in the data structure 410.

In some examples, when an IP packet is assembled from a set of bytes in the buffer 404 that is adjacent to the start position 406 or the end position 408, the receiving sliding window 402 may shrink so that the start position 406 moves forward or the end position 402 moves backwards. If the extracted IP packet is in the middle of the receiving sliding window 402, the start and end positions may not change as the extracted IP packet may be located entirely within the interior of the receiving sliding window 402. The receiving sliding window mechanism may be able to identify that an interior IP packet has been removed based on the value 412 stored in the data structure 410. Thus, the receiving sliding window mechanism may not perform a determination whether the corresponding bytes should be analyzed to determine if a full IP packet is ready for extraction.

In some examples, the slots following the start position 406 are associated with a bytes that the receiving device has not received and that the sending device has transmitted a maximum number of times, and thus has stopped retransmitting. In these examples, the receiving sliding window may advance the start position 406 when the receiving sliding window 404 exceeds or reaches a predetermined threshold length. The predetermined threshold may be the same or larger than a maximum size of the sending sliding window.

Figure 5:
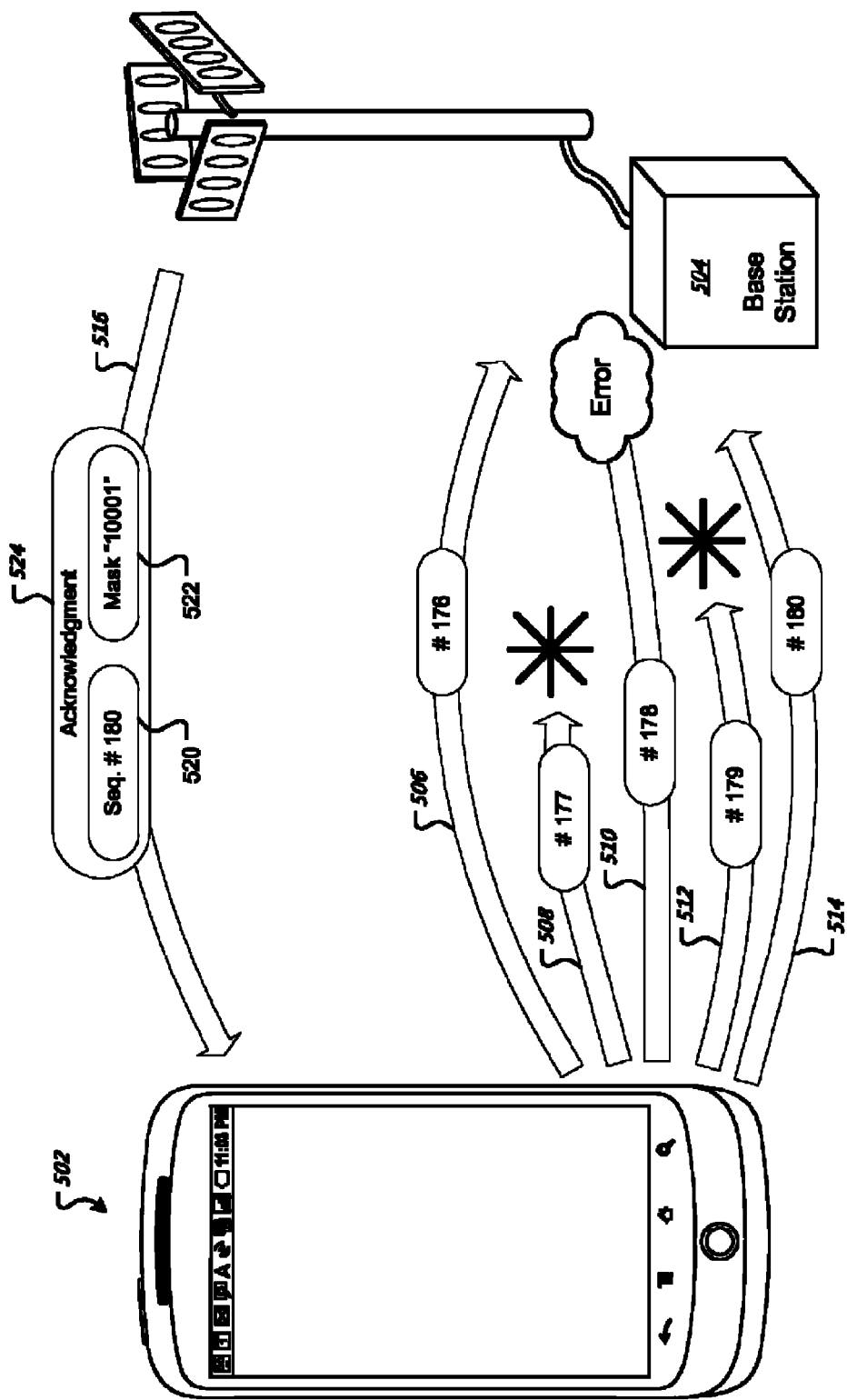
FIG. 5 is a conceptual diagram of a system that acknowledges packets using a sequence number and a bit mask.

FIG. 5 is a conceptual diagram of a system that acknowledges packets using a sequence number and a bit mask. In this illustration a mobile telephone 502 has sequentially transmitted five packets to the base station 504. The packets may represent packets that are assembled at a particular layer in an OSI model, and may not represent packets that are transmitted at a physical layer between the mobile telephone 502 and the base station 504. Each packet includes a sequence number that is illustrated in an oval (e.g., numbers 176, 177, 178, 179, and 180). The sliding window mechanism of the mobile telephone inserts the sequence number into the MAC packet (e.g., in the "Sequence Number" field 306 illustrated in FIG. 3). With each assembled packet, the sending sliding window mechanism of the mobile telephone 502 may increment the sequence number.

In this illustration, the sliding window mechanism in the mobile telephone 502 inserted the sequence number "176" in the first packet 506. As illustrated by the arrow spanning all the way to the base station 504, the packet 506 was successfully received error-free by the base station 504. Packet 508, however, was lost in transmission, as illustrated by the terminating "star." Packet 510 was received at the base station 504, but as illustrated by the "Error" cloud, the packet 510 included an error. Packet 512 was lost in transmission and packet 514 was successfully received by the base station 504.

Base station 504 may periodically transmit packets to the mobile telephone 502 in accordance with the sending sliding window mechanism described throughout this document. As illustrated in FIG. 3, a transmitted MAC packet may include an "Ack Seq Number" field 308 and an "Ack Seq Mask" field 310. In these two fields the base station 504 may transmit data that identifies packets that the base station 504 successfully received from the mobile telephone 502.

In this illustration, the base station as successfully received packets with sequence numbers of "176" and "180." Thus, the base station can insert Sequence Number "180" as an indication of the most recently received packet 520 (e.g., as the "Ack Seq Number" 308), and can generate a mask 522 as an indication of whether packets adjacent in sequence number to "180" were received or not received by the base station 504. For illustrative purposes, the mask in this example is five bits long The first bit indicates that sequence number "180" was successfully received, the fifth bit indicates that sequence number "176" was received, and bits two through four indicate that sequence numbers "177," "178," and "179" were not received. Similarly, the application of the bits may be reversed so that the first bit corresponds to sequence number "176." In some examples, a "1" indicates that a packet was not received and a "0" indicates that the packet was received.

In some examples, use of the sequence number "180" in the acknowledgment 524 indicates that the sequence number "180" was successfully received. Thus, the mask may not include a mask for sequence number "180." Appropriately, a four bit mask may be used to reference the packets with sequence numbers "176" to "179." Thus, the mask may be either "0001," "1000," "1110," or "0111" depending on a standardized application of the bits.

In some examples, the mask represents packets that are "adjacent" to the sequence number 520. In other words, the mask may represent acknowledgments for packets that are either directly before or after the sequence number 520, without any intervening space in sequence number. In some examples, the mask represents a sequential listing of sequence numbers. For example, the sequential listing may be for numbers "334," "335," and "336." Irregularly spaced sequence numbers may not be sequential. In some examples, a sequential listing includes numbers that are spaced with a regular pattern. For example, the mask "101" may represent an acknowledgment status of packets with sequence number "334," "336," and 338."

In various implementations, the mechanisms described in reference to FIG. 5 (and throughout this document) may be applied bi-directionally such that the mobile telephone 502 and the base station 504 each implement the described sending sliding window and receiving sliding window. For example, the mobile telephone 502 may receive multiple packets 506-514 from the base station 504 and send an acknowledgment 524 to the base station 504.

In various examples, a packet is a portion of a stream of data being transmitted between two computing devices. A start to the packet may be designated with a special character or a header. In various examples, a data portion is a bit, a set of bits, a byte, a word, or a packet. In various examples, while "filling" the sliding window may be discussed in reference to the MAC layer, the sliding window may be implemented at other OSI layers. Such a conceptual description of filling the MAC layer may correspond to the creation, at the physical layer, of a string of bytes that model a sliding window.

Figure 6:
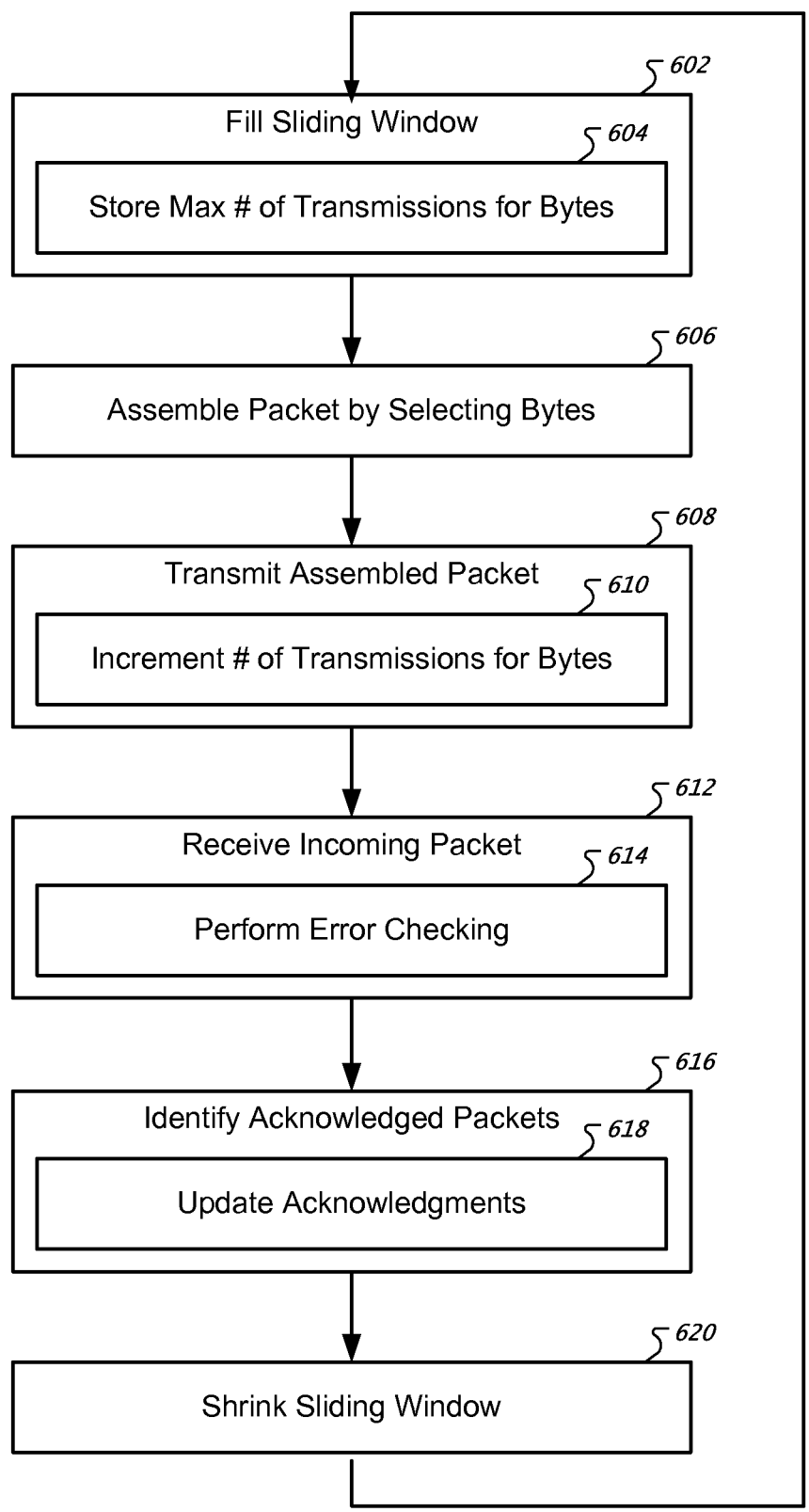
FIG. 6 is a flow chart of an example process for performing adaptive data unit transmission and acknowledgment.

FIG. 6 is a flow chart of an example process for performing adaptive data unit transmission and acknowledgment. In box 602, a sliding window is filled with data. For example, the sliding window 202 may be filled with bytes from the IP packets of queue 228. In some examples, an IP packet is added to the sliding window 202 when the number of slots in the sliding window falls below a threshold.

In box 604 a maximum number of transmissions for each of the bytes in the sliding window are stored. For example, a maximum number of retransmissions 222 for the bytes 216a-i are stored in the data structure 214. The maximum number of retransmissions may be determined based on a type of the higher level packet. In some examples, each of the bytes from a higher level packet will have a same maximum number of retransmissions. Bytes in different higher level packets, however, may differ in their respective maximum number of retransmissions.

In box 606, a packet is assembled by selecting bytes. For example, MAC packet 300 may be assembled using data bytes 374 that are selected from the sliding window 202. The bytes that are selected may be those bytes that start at the current position 210 that are not acknowledged and that have not been either transmitted or retransmitted the maximum number of times 224. The packet may be assembled by selecting bytes until either a maximum number of bytes for the packet have been selected or a byte that has been retransmitted a maximum number of times is encountered.

In box 608, the assembled packet is transmitted from a first computing device to a second computing device. For example, a base station 504 may assemble the packet and transmit the packet to mobile telephone 502. Transmitting the packet may include placing the packet into a network for transmission to the mobile telephone 502.

In box 610, a number of transmissions for the transmitted bytes is incremented. For example, if the transmitted packet includes bytes 216d, 216e and 216h, the number of retransmissions 222 for each of the respective bytes may be incremented by one.

In box 612, an incoming packet is received. For example, the mobile telephone 502 receives the packet 516 that has been transmitted by the base station 504. Receiving the packet 516 may include retrieving the packet from a signal transmitted through the air, where the packet 516 was placed into the signal by the base station 504.

In box 614, error checking on the received packet is performed. For example a CRC check on the data in the received packet may be performed using the CRC value in the CRC field 318. A valid packet may be a packet that passes the CRC check.

In box 616, acknowledged packets are identified. For example, the mobile telephone 502 may receive an "Ack Seq Number" 308 and an "Ack Seq Mask" 310. As described throughout this document, the "Ack Seq Number" 308 may be used to identify a particular packet that the mobile telephone 502 had previously transmitted to the base station 504. The "Ack Seq Mask" 310 may identify, for each bit in the mask 310, whether or not a corresponding packet has been acknowledged. The bits may represent packets with sequence numbers that are based on the "Ack Seq Number" 308 (e.g., packets with sequence numbers that are a predetermined amount higher or lower than the "Ack Seq Number" 308).

In box 618, the acknowledgments are updated. For example, the acknowledgments 226 row in the data structure 214 may be updated so that slots in the sliding window 202 with bytes that have been acknowledged have a value of "1."

In box 620, the sliding window is shrunk. For example, the start position 208 may be moved forward if the byte 216a has either been acknowledged or if the byte has been retransmitted a maximum number of times.

Figure 7:
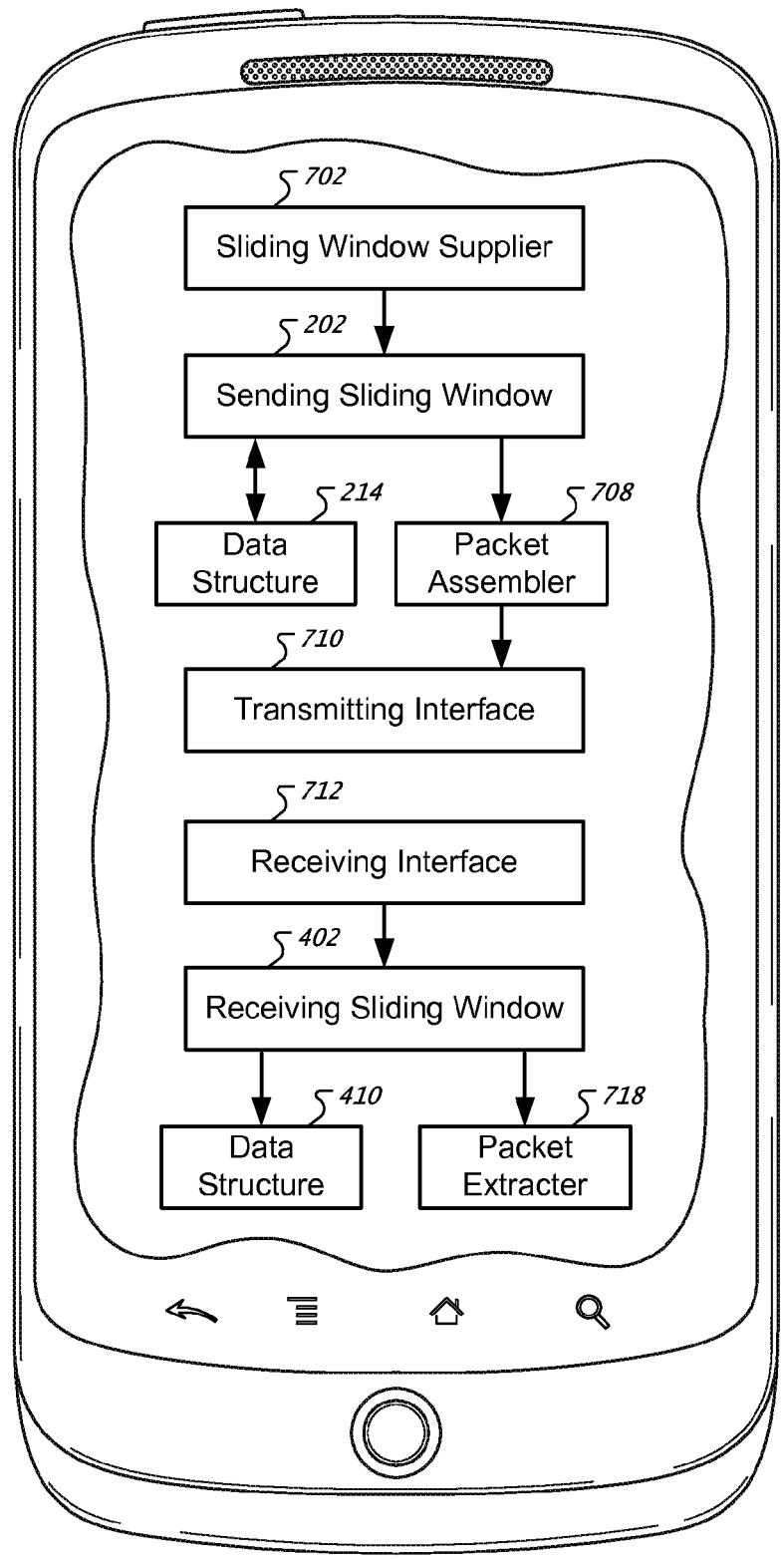
FIG. 7 is a block diagram of an example system for performing adaptive data unit transmission and acknowledgment.

FIG. 7 is a block diagram of an example system for performing adaptive data unit transmission and acknowledgment. The sliding window supplier 702 provides bytes of information to fill the sending sliding window 202. For example, the sliding window supplier 702 may retrieve IP packets from the queue 228 and place those IP packets in the sending sliding window 202. The data structure 214 may include data for each of the slots in the sliding window 202.

The packet assembler 708 may retrieve bytes from the sending sliding window 202 that have not been acknowledged and that have not been transmitted a maximum number of times. The packet assembler 708 may generate a MAC packet 300 with relevant header information.

The transmitting interface 710 may receive a MAC packet from the packet assembler 708 and transmit the MAC packet to a MAC layer of another computerized device. For example, the assembled MAC packet may be provided to a lower layer that provides the packet for wireless transmission to a different computerized device.

The receiving interface 712 may receive an incoming MAC packet that was transmitted by another computerized device and may provide bytes from the received MAC packet to corresponding slots in the receiving sliding window 402. The packet extractor 718 may determine if the receiving sliding window 402 includes a full IP packet, may extract the packet, and may resize the receiving sliding window 402. The data structure 410 may identify which IP packets have been extracted.

Figure 8:
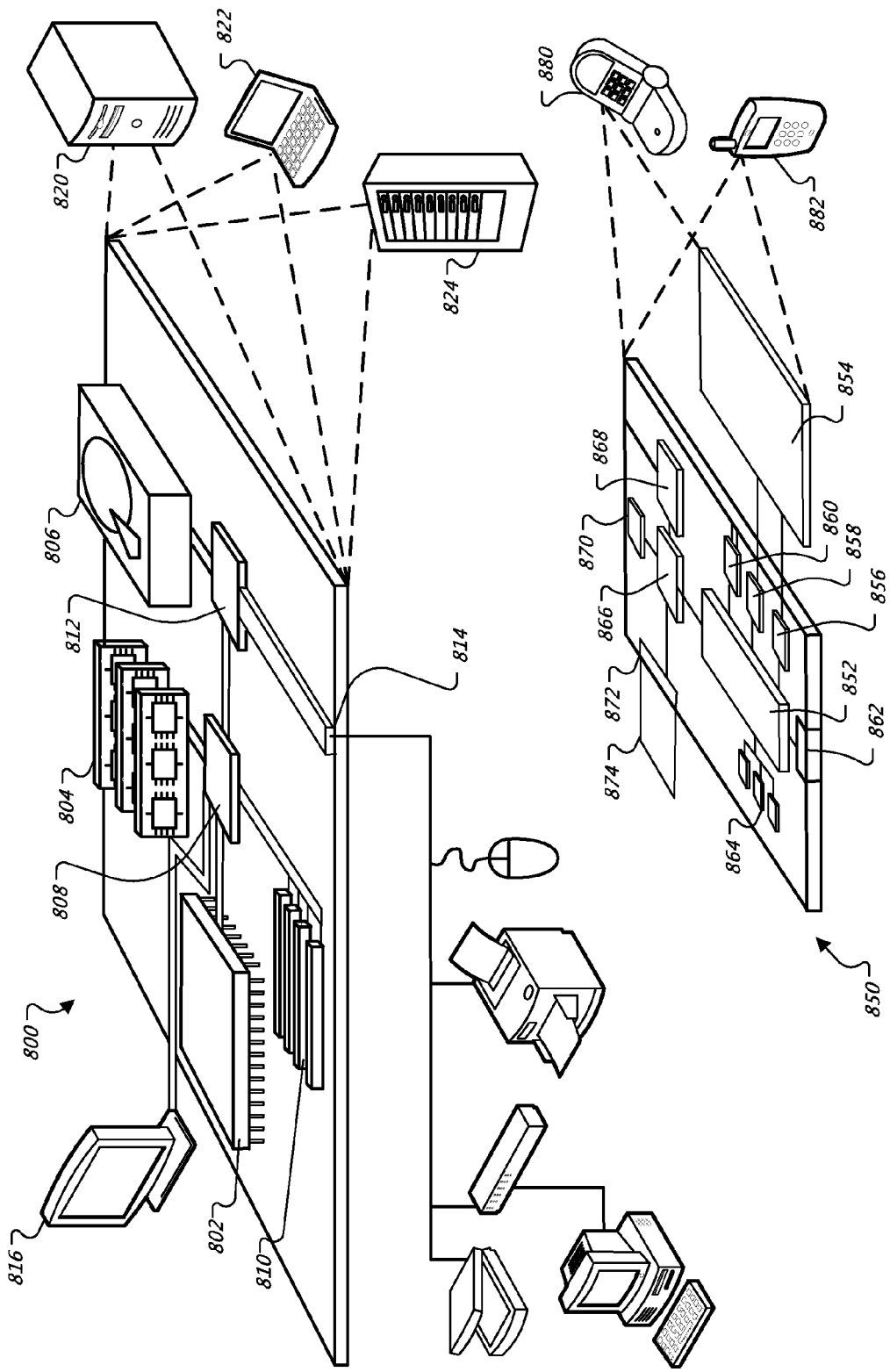
FIG. 8 is a block diagram of computing devices that may be used to implement the systems and methods described in this document, as either a client or as a server or plurality of servers.

FIG. 8 is a block diagram of computing devices 800, 850 that may be used to implement the systems and methods described in this document, as either a client or as a server or plurality of servers. Computing device 800 is intended to represent various forms of digital computers, such as laptops, desktops, workstations, personal digital assistants, servers, blade servers, mainframes, and other appropriate computers. Computing device 850 is intended to represent various forms of mobile devices, such as personal digital assistants, cellular telephones, smartphones, and other similar computing devices. Additionally computing device 800 or 850 can include Universal Serial Bus (USB) flash drives. The USB flash drives may store operating systems and other applications. The USB flash drives can include input/output components, such as a wireless transmitter or USB connector that may be inserted into a USB port of another computing device. The components shown here, their connections and relationships, and their functions, are meant to be exemplary only, and are not meant to limit implementations described and/or claimed in this document.

Computing device 800 includes a processor 802, memory 804, a storage device 806, a high-speed interface 808 connecting to memory 804 and high-speed expansion ports 810, and a low speed interface 812 connecting to low speed bus 814 and storage device 806. Each of the components 802, 804, 806, 808, 810, and 812, are interconnected using various busses, and may be mounted on a common motherboard or in other manners as appropriate. The processor 802 can process instructions for execution within the computing device 800, including instructions stored in the memory 804 or on the storage device 806 to display graphical information for a GUI on an external input/output device, such as display 816 coupled to high speed interface 808. In other implementations, multiple processors and/or multiple buses may be used, as appropriate, along with multiple memories and types of memory. Also, multiple computing devices 800 may be connected, with each device providing portions of the necessary operations (e.g., as a server bank, a group of blade servers, or a multi-processor system).

The memory 804 stores information within the computing device 800. In one implementation, the memory 804 is a volatile memory unit or units. In another implementation, the memory 804 is a non-volatile memory unit or units. The memory 804 may also be another form of computer-readable medium, such as a magnetic or optical disk.

The storage device 806 is capable of providing mass storage for the computing device 800. In one implementation, the storage device 806 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 804, the storage device 806, or memory on processor 802.

The high speed controller 808 manages bandwidth-intensive operations for the computing device 800, while the low speed controller 812 manages lower bandwidth-intensive operations. Such allocation of functions is exemplary only. In one implementation, the high-speed controller 808 is coupled to memory 804, display 816 (e.g., through a graphics processor or accelerator), and to high-speed expansion ports 810, which may accept various expansion cards (not shown). In the implementation, low-speed controller 812 is coupled to storage device 806 and low-speed expansion port 814. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 800 may be implemented in a number of different forms, as shown in the figure. For example, it may be implemented as a standard server 820, or multiple times in a group of such servers. It may also be implemented as part of a rack server system 824. In addition, it may be implemented in a personal computer such as a laptop computer 822. Alternatively, components from computing device 800 may be combined with other components in a mobile device (not shown), such as device 850. Each of such devices may contain one or more of computing device 800, 850, and an entire system may be made up of multiple computing devices 800, 850 communicating with each other.

Computing device 850 includes a processor 852, memory 864, an input/output device such as a display 854, a communication interface 866, and a transceiver 868, among other components. The device 850 may also be provided with a storage device, such as a microdrive or other device, to provide additional storage. Each of the components 850, 852, 864, 854, 866, and 868, are interconnected using various buses, and several of the components may be mounted on a common motherboard or in other manners as appropriate.

The processor 852 can execute instructions within the computing device 850, including instructions stored in the memory 864. The processor may be implemented as a chipset of chips that include separate and multiple analog and digital processors. Additionally, the processor may be implemented using any of a number of architectures. For example, the processor 810 may be a CISC (Complex Instruction Set Computers) processor, a RISC (Reduced Instruction Set Computer) processor, or a MISC (Minimal Instruction Set Computer) processor. The processor may provide, for example, for coordination of the other components of the device 850, such as control of user interfaces, applications run by device 850, and wireless communication by device 850.

Processor 852 may communicate with a user through control interface 858 and display interface 856 coupled to a display 854. The display 854 may be, for example, a TFT (Thin-Film-Transistor Liquid Crystal Display) display or an OLED (Organic Light Emitting Diode) display, or other appropriate display technology. The display interface 856 may comprise appropriate circuitry for driving the display 854 to present graphical and other information to a user. The control interface 858 may receive commands from a user and convert them for submission to the processor 852. In addition, an external interface 862 may be provide in communication with processor 852, so as to enable near area communication of device 850 with other devices. External interface 862 may provide, for example, for wired communication in some implementations, or for wireless communication in other implementations, and multiple interfaces may also be used.

The memory 864 stores information within the computing device 850. The memory 864 can be implemented as one or more of a computer-readable medium or media, a volatile memory unit or units, or a non-volatile memory unit or units. Expansion memory 874 may also be provided and connected to device 850 through expansion interface 872, which may include, for example, a SIMM (Single In Line Memory Module) card interface. Such expansion memory 874 may provide extra storage space for device 850, or may also store applications or other information for device 850. Specifically, expansion memory 874 may include instructions to carry out or supplement the processes described above, and may include secure information also. Thus, for example, expansion memory 874 may be provide as a security module for device 850, and may be programmed with instructions that permit secure use of device 850. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 864, expansion memory 874, or memory on processor 852 that may be received, for example, over transceiver 868 or external interface 862.

Device 850 may communicate wirelessly through communication interface 866, which may include digital signal processing circuitry where necessary. Communication interface 866 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 868. In addition, short-range communication may occur, such as using a Bluetooth, WiFi, or other such transceiver (not shown). In addition, GPS (Global Positioning System) receiver module 870 may provide additional navigation- and location-related wireless data to device 850, which may be used as appropriate by applications running on device 850.

Device 850 may also communicate audibly using audio codec 860, which may receive spoken information from a user and convert it to usable digital information. Audio codec 860 may likewise generate audible sound for a user, such as through a speaker, e.g., in a handset of device 850. Such sound may include sound from voice telephone calls, may include recorded sound (e.g., voice messages, music files, etc.) and may also include sound generated by applications operating on device 850.

The computing device 850 may be implemented in a number of different forms, as shown in the figure. For example, it may be implemented as a cellular telephone 880. It may also be implemented as part of a smartphone 882, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), peer-to-peer networks (having ad-hoc or static members), grid computing infrastructures, and the Internet.

The computing system can include clients and servers. A client and server are generally remote from each other and typically interact through a communication network. The relationship of client and server arises by virtue of computer programs running on the respective computers and having a client-server relationship to each other.

Although a few implementations have been described in detail above, other modifications are possible. Moreover, other mechanisms for performing adaptive data unit transmission and acknowledgment may be used. In addition, the logic flows depicted in the figures do not require the particular order shown, or sequential order, to achieve desirable results. Other steps may be provided, or steps may be eliminated, from the described flows, and other components may be added to, or removed from, the described systems. Accordingly, other implementations are within the scope of the following claims.

What is claimed is:

1. A computer-implemented method, comprising:
   receiving, by a first computing device, data packets that were transmitted by a second computing device as part of a first data transmission of multiple data packets;
   identifying, by the first computing device, at least some of the received data packets as being data packets for which the first computing device should send, for receipt by the second computing device, an acknowledgement that the at least some of the received data packets were successfully received by the first computing device; and
   sending, by the first computing device and for receipt by the second computing device, a second data transmission that includes, as the acknowledgment that the at least some of the received data packets were successfully received by the first computing device:
   (i) a multi-bit identification of one of the multiple data packets in the first data transmission, and
   (ii) multiple bits, each of the multiple bits representing an acknowledgment or non-acknowledgment of a data packet in the first data transmission of multiple data packets,
   wherein the second data transmission includes, for each of the at least some of the received data packets, a bit that represents an acknowledgement of the respective data packet.

2. The computer-implemented method of claim 1, wherein:
   the received data packets are a subset of the multiple data packets that were received by the first computing device as part of the first data transmission; and
   the second data transmission includes, for each of the multiple data packets that is not one of the at least some of the received data packets, a bit that represents non-acknowledgement of the respective data packet.

3. The computer-implemented method of claim 1, further comprising:
   performing, by the first computing device, an error-checking operation; and
   identifying, by the first computing device, the at least some of the received data packets are being a subset of the received data packets that satisfy the error-checking algorithm.

4. The computer-implemented method of claim 3, wherein the error-checking operation includes a cyclic redundancy check error-checking algorithm.

5. The computer-implemented method of claim 3, wherein the second data transmission includes, for each of the received data packets that did not satisfy the error-checking operation, a bit that represents non-acknowledgment of the respective data packet.

6. The computer-implemented method of claim 1, wherein:
   the first data transmission includes a wireless transmission of the multiple data packets;
   the second data transmission includes a wireless transmission of the multi-bit identification and the multiple bits; and
   each of the multiple data units is a byte.

7. The computer-implemented method of claim 1, wherein each of the multiple bits represents an acknowledgment or a non-acknowledgment for each corresponding packet in group of sequential packets.

8. The computer-implemented method of claim 1, wherein the multiple bits represent acknowledgment or non-acknowledgment of multiple different packets using a single bit for each respective packet to indicate acknowledgment or non-acknowledgment of the respective packet.

9. The computer-implemented method of claim 1, wherein the multi-bit identification of the packet and the multiple bits are included in a single packet that the first computing device transmits for receipt by the second computing device as part of the second data transmission.

10. The computer-implemented method of claim 1, wherein the multi-bit identification of the one of the multiple data packets is a packet sequence identifier that the first computing device received in the one of the multiple data packets, wherein the packet sequence identifier distinguishes the one of the multiple data packets from other of the multiple data packets.

11. A computer-readable non-transitory medium including instructions that, when executed by one or more computer processors, cause performance of operations that comprise:
   receiving, by a first computing device, data packets that were transmitted by a second computing device as part of a first data transmission of multiple data packets;
   identifying, by the first computing device, at least some of the received data packets as being data packets for which the first computing device should send, for receipt by the second computing device, an acknowledgement that the at least some of the received data packets were successfully received by the first computing device; and
   sending, by the first computing device and for receipt by the second computing device, a second data transmission that includes, as the acknowledgment that the at least some of the received data packets were successfully received by the first computing device:
      (i) a multi-bit identification of one of the multiple data packets in the first data transmission, and
      (ii) multiple bits, each of the multiple bits representing an acknowledgment or non-acknowledgment of a data packet in the first data transmission of multiple data packets,
   wherein the second data transmission includes, for each of the at least some of the received data packets, a bit that represents an acknowledgement of the respective data packet.

12. The computer-readable non-transitory medium of claim 11, wherein:
   the received data packets are a subset of the multiple data packets that were received by the first computing device as part of the first data transmission; and
   the second data transmission includes, for each of the multiple data packets that is not one of the at least some of the received data packets, a bit that represents non-acknowledgement of the respective data packet.

13. The computer-readable non-transitory medium of claim 11, wherein the operations further comprise:
   performing, by the first computing device, an error-checking operation; and
   identifying, by the first computing device, the at least some of the received data packets are being a subset of the received data packets that satisfy the error-checking algorithm.

14. The computer-readable non-transitory medium of claim 13, wherein the error-checking operation includes a cyclic redundancy check error-checking algorithm.

15. The computer-readable non-transitory medium of claim 13, wherein the second data transmission includes, for each of the received data packets that did not satisfy the error-checking operation, a bit that represents non-acknowledgment of the respective data packet.

16. The computer-readable non-transitory medium of claim 11, wherein:
   the first data transmission includes a wireless transmission of the multiple data packets;
   the second data transmission includes a wireless transmission of the multi-bit identification and the multiple bits; and
   each of the multiple data units is a byte.

17. The computer-readable non-transitory medium of claim 11, wherein each of the multiple bits represents an acknowledgment or a non-acknowledgment for each corresponding packet in group of sequential packets.

18. The computer-readable non-transitory medium of claim 11, wherein the multiple bits represent acknowledgment or non-acknowledgment of multiple different packets using a single bit for each respective packet to indicate acknowledgment or non-acknowledgment of the respective packet.

19. The computer-readable non-transitory medium of claim 11, wherein the multi-bit identification of the packet and the multiple bits are included in a single packet that the first computing device transmits for receipt by the second computing device as part of the second data transmission.

20. The computer-readable non-transitory medium of claim 11, wherein the multi-bit identification of the one of the multiple data packets is a packet sequence identifier that the first computing device received in the one of the multiple data packets, wherein the packet sequence identifier distinguishes the one of the multiple data packets from other of the multiple data packets.

* * * * *